United States Patent
Schunke et al.

[11] Patent Number: 5,834,810
[45] Date of Patent: Nov. 10, 1998

[54] ASYMMETRICAL VERTICAL LIGHTLY DOPED DRAIN TRANSISTOR AND METHOD OF FORMING THE SAME

[75] Inventors: J. Neil Schunke; David Zaterka; Thomas S. Taylor, all of Durham, N.C.

[73] Assignee: Mitsubishi Semiconductor America, Inc., Durham, N.C.

[21] Appl. No.: 733,309

[22] Filed: Oct. 17, 1996

[51] Int. Cl.⁶ .................................................. H01L 21/336
[52] U.S. Cl. ........................... 257/336; 257/344; 257/408; 257/623
[58] Field of Search .................... 257/344, 408, 257/336, 335, 337, 618, 623

[56] References Cited

U.S. PATENT DOCUMENTS

| | | | |
|---|---|---|---|
| H986 | 11/1991 | Codella et al. | 257/344 |
| 5,008,723 | 4/1991 | van der Have | 257/43 |
| 5,041,885 | 8/1991 | Gualandris et al. | 257/43 |
| 5,061,975 | 10/1991 | Inuishi et al. | 257/344 |
| 5,082,796 | 1/1992 | El-Diwany et al. | 437/44 |
| 5,122,856 | 6/1992 | Komiya | 357/55 |
| 5,200,352 | 4/1993 | Pfiester | 438/44 |
| 5,202,576 | 4/1993 | Liu et al. | 275/315 |
| 5,225,703 | 7/1993 | Nakatani | 257/401 |
| 5,258,319 | 11/1993 | Inuishi et al. | 437/35 |
| 5,262,337 | 11/1993 | Kim | 257/336 |
| 5,270,226 | 12/1993 | Hori et al. | 437/35 |
| 5,319,231 | 6/1994 | Yamazaki et al. | 257/347 |
| 5,345,104 | 9/1994 | Prall et al. | 257/607 |
| 5,565,700 | 10/1996 | Chou et al. | 257/336 |
| 5,583,364 | 12/1996 | Nakamura | 257/408 |
| 5,640,035 | 6/1997 | Sudo et al. | 257/344 |

FOREIGN PATENT DOCUMENTS

| | | | |
|---|---|---|---|
| 2-7475 | 1/1990 | Japan | 257/344 |
| 2-299271 | 12/1990 | Japan | 257/344 |
| 4-212466 | 8/1992 | Japan | 257/344 |

*Primary Examiner*—Donald Monin
*Attorney, Agent, or Firm*—McDermott, Will & Emery

[57] ABSTRACT

An asymmetrical vertical lightly doped drain metal oxide semiconductor field effect transistor (VLDD MOSFET) is formed on a semiconductor substrate. The substrate includes first and second main planar surfaces with the second main planar surface parallel to and positioned at a height lower that the first main planar surface. A third planar surface, generally normal to the first and second main planar surfaces, connects the first and second main planar surfaces on the drain region side of the channel region. The source region is formed in a portion of the first main planar surface, and the drain region is formed in the third planar surfaces and portions of the first and second main planar surfaces. Contours of equal ion concentration in the drain region are non-Gaussian and an interface between the channel region and drain region is generally linear beneath the gate electrode adjacent the generally normal third planar surface.

6 Claims, 7 Drawing Sheets

ASYMMETRICAL VERTICAL LIGHTLY DOPED DRAIN TRANSISTOR AND METHOD OF FORMING THE SAME

FIELD OF THE INVENTION

The invention relates generally to semiconductor transistor devices. More particularly, the invention relates to improvements in an asymmetrical vertical lightly doped drain (VLDD) metal oxide semiconductor field effect transistor (MOSFET) suitable for use in ultra large scale integration (ULSI) devices.

BACKGROUND OF THE INVENTION

As a result of the drive to make semiconductor devices as small as possible, the gate length of a MOSFET has become 1 μm or less. To suppress any deterioration in driving ability which might occur in such an extremely small structure, diffusion depth of the source/drain regions is made shallow or the gate dielectric film is thinned according to a reduction of the gate length. However, strong electrical fields are usually present in these ultra small MOSFETs, causing driving characteristics of the MOSFET to degrade as a result of hot carriers. More specifically, such an ultra small MOSFET will generally have a strong internal electrical field concentrated beneath the gate electrode in the vicinity of the drain region resulting in the injection of hot carriers into the gate oxide film. This generates a trap state or interface state in the gate oxide film which can cause fluctuation in the threshold voltage or reduction in current gain.

To reduce the hot electron phenomenon, the electrical field in the vicinity of the drain region has been reduced using what is known as a lightly doped drain (LDD) structure. In the LDD structure, a diffusion area of lower concentration is formed in the drain region, underneath a portion of the gate electrode. An example of a conventional LDD MOSFET is shown in FIG. 1(f). This LDD MOSFET has a gate electrode 20 formed on a silicon substrate 22 with a gate dielectric film 24 interposed therebetween. Sidewall oxides 26a and 26b are formed on opposing sides of the gate electrode 20, source/drain regions 28 and 30 are formed in the silicon substrate on one side of the gate electrode, and source/drain regions 32 and 34 are formed in the silicon substrate on the opposing side of the gate electrode.

Source/drain regions 28, 30, 32 and 34 are of opposite conductivity type than that of the silicon substrate 22 with the regions 30 and 32 being of lower concentration than the regions 28 and 34. Region 30 is formed under a portion of the sidewall oxide 26a and a portion of the gate dielectric film 24 with region 32 formed under a portion of the sidewall oxide 26b and a portion of the gate dielectric film 24. Region 28 is formed adjacent region 30 and under a portion of the sidewall oxide 26a, and region 34 is formed adjacent region 32 and under a portion of the sidewall oxide 26b.

Referring to FIGS. 1(a) to 1(f), a method for forming the LDD MOSFET shown in FIG. 1(f) is described. As shown in FIG. 1(a), a gate dielectric film 24a is formed on a main surface of the silicon substrate 22 and the gate electrode film 20a is formed on the gate dielectric film 24a. Patterned resist 36 is then formed on the gate electrode film 20a, and is used to pattern and form gate electrode 20 and gate dielectric film 24 as shown in FIG. 1(b). In particular, anisotropic etching, such as reactive ion etching, is used to form gate electrode 20 and gate dielectric film 24. The patterned resist 36 is removed and then low concentration level ions of a conductivity type opposite to that of the silicon substrate 22 are implanted and diffused in the substrate using the gate electrode 20 and the gate dielectric film 24 as a mask to form low concentration source/drain regions 30 and 32, as shown in FIG. 1(c). Alternatively, the ions can be injected prior to removal of the patterned resist 36.

Next, oxide film 38 is deposited over the gate electrode 20 and the silicon substrate 22, as shown in FIG. 1(d), using chemical vapor deposition (CVD). Subsequently, anisotropic etching, such as reactive ion etching, is performed to form sidewalls 26a and 26b on opposing sides of the gate electrode 20 as shown in FIG. 1(e). Finally, ions, of a conductivity type opposite to that of the silicon substrate 22, and having a concentration level greater than the concentration level of the ions used to form source/drain regions 30a and 32a, are implanted and diffused in the substrate using the gate electrode 20, the gate dielectric film 24 and the sidewall oxides 26a and 26b as a mask to form high concentration source/drain regions 28 and 34 as shown in FIG 1(c).

The manufacturing process of this conventional LDD MOSFET is complex due to the formation of the oxide film on the gate electrode and the silicon substrate, and then etching the same to form the sidewall oxides.

As an alternative to forming an LDD MOSFET, U.S. Pat. No. 5,041,885 to Gualandris et al. describes formation of a vertical MOSFET structure where the surface of the semiconductor substrate is depressed in the area of the source/drain regions relative to the level of semiconductor substrate in the gate area. This structure allows the region of maximum electric field intensity to be shifted from the critical zone of the transistor. The shift of the region of maximum electric field intensity deters injection of hot carriers into the gate oxide. In addition, the manufacturing process is less complex as only etching of the substrate in the source/drain regions is necessary, and the degree of integration is not restricted by sidewall oxides.

The source/drain regions of the MOSFET made in accordance with U.S. Pat. No. 5,041,885 to Gualandris et al. are formed by diffusing, in the silicon substrate, a dopant capable of inducing an electrical conductivity of a polarity opposite to the polarity of the channel region. However, the driving characteristics of this MOSFET are not satisfactory as a result of such diffusion. More specifically, referring to FIG. 2, U.S. Pat. No. 5,041,885 to Gualandris et al. uses implantation and diffusion to create the source/drain regions along the vertical edges of the transistor gate. A dopant species is first implanted in the substrate and then diffused as shown in FIG. 2. This creates a doping profile with a Gaussian distribution, as diffusion of dopant is equal in all directions. That is, there is essentially a 1:1 ratio of movement along both the X and Y axes. As a result, the respective boundary between each of the source/drain regions and the channel region has a curvature substantially constant radius throughout the extent of the semiconductor substrate between the source/drain regions and the gate electrode.

However, as dopant atoms move inward and towards the source/drain edge of the gate oxide, the channel length of the transistor is shortened. As the distance between the drain region and the source region becomes smaller, the breakdown voltage between the drain and source regions becomes similarly smaller. Low breakdown voltage can result in a malfunction of the MOSFET as conduction between the source and drain regions can occur at a voltage which is lower than that which is required for proper operation of the MOSFET.

Another doping technique is disclosed in U.S. Pat. No. 5,041,885 to Gualandris et al., a so-called graduated drain doping (GDD). In GDD, oxide spacers are formed on both sides of the gate electrode of the vertical MOSFET prior to ion implanting. As in a LDD MOSFET, the GDD technique couples the channel region of the transistor to the drain junction region (having a relatively high impurity concentration) through an intermediate region doped with impurities of the same type as the impurities of the drain region, but having a concentration lower than the drain region by at least one or two orders of magnitude. Coupling of the channel region to the drain junction region through an intermediate region of the same impurity type, but of relatively low impurity concentration, as that of the drain region provides well known advantages.

The GDD technique consists of implanting the source/drain areas, defined by oxide spacers, first with a certain dopant species having a certain coefficient in silicon, partially diffusing the implanted atoms and then with the same dopant species or with different dopant species of the same polarity but having a diffusion coefficient in silicon lower than the first implanted species. This is followed by a diffusion heat treatment. The oxide spacers provide a mechanism to provide acceptable distance between the drain region and the source region, thereby maintaining an appropriate breakdown voltage.

In the GDD technique, the dopant species are first implanted in regions of the substrate defined by the oxide spacers, as shown in FIG. 3(a), and then diffused as shown in FIG. 3(b). A second implantation and diffusion is then carried out creating contours of equal ion concentration having a Gaussian distribution as shown in FIG. 4.

However, as for the conventional LDD MOSFET, the manufacturing process for the embodiment using the GDD technique is complex, since oxide spacers are required to be formed.

As a vertical MOSFET having the channel region coupled to the drain junction region through an intermediate region of the same impurity type as the drain region, but having a relatively low impurity concentration, provides many advantages, it is desirable to use such structure in ULSI devices. However, highly integrated MOSFET devices as aforementioned are plagued by low withstand voltage characteristics or are complicated in manufacture by gate sidewall oxides.

Copending application U.S. Ser. No. 08/733,311, filed 1996, incorporated herein by reference, discloses a symmetrical vertical LDD (VLDD) MOSFET, and process of making the same. The VLDD MOSFET of the copending application is easy to manufacture as sidewall oxides are not formed, and the source/drain regions have an injection doping profile and not a diffusion doping profile. Frequently though, higher performance, e.g. speed, than is provided by the symmetrical VLDD MOSFET is required. In such case, it is necessary to provide an asymmetrical VLDD MOSFET.

U.S. Pat. No. 5,041,885 to Gualandris et al. suggests that the semiconductor substrate may be excavated only in the drain region area. However, as diffusion is required to form the source/drain regions, the channel length of the transistor is shortened, reducing the drain to source breakdown voltage. In addition, the manufacturing process for the embodiment using the GDD technique is complex since an oxide spacer is required to be formed on the drain region side of the gate electrode.

SUMMARY OF THE INVENTION

It is a feature and advantage of the invention to provide an asymmetrical vertical MOSFET which couples the channel region to the drain junction region through an intermediate region of relatively low concentration.

It is another feature and advantage of the invention to provide an asymmetrical vertical LDD MOSFET without gate sidewall oxides.

It is another feature and advantage of the invention to provide an asymmetrical VLDD MOSFET in which source/drain regions are formed without diffusion.

It is another feature and advantage of the invention to provide a method of forming an asymmetrical VLDD MOSFET without gate sidewall oxides and without diffusion of the source/drain regions.

According to the present invention, the foregoing features and advantages are attained by an FET comprising a semiconductor substrate including a first region having a generally planar upper surface and a second region, projecting upwardly from the first region, having a generally planar upper surface. The second substrate region has a sidewall generally normal to the upper surface of the first region. The FET also comprises a gate electrode formed through an insulating film, on the upper surface of the second substrate region, a source impurity region formed in the second substrate region on a first side of the gate electrode, and a drain impurity region formed in the first region and the second substrate region on a second side of the gate electrode, opposing the first side. A channel region is established beneath the gate electrode and the drain impurity region has contours of equal ion concentration which are non-Gaussian.

In accordance with one aspect of the invention the source/drain impurity regions (i) are formed without diffusion by injecting ions at an oblique angle to the semiconductor substrate from a continuously rotating ion source, and (ii) increase in concentration in a lateral direction form the interface between the channel region and each source/drain region. The drain region has contours of equal ion concentration which are non-Gaussian.

In accordance with another aspect of the invention an interface between the channel region and the drain region is generally linear beneath the gate electrode adjacent the sidewall of the second substrate region.

In accordance with still another aspect of the invention, a method of forming a semiconductor FET is provided comprising the steps of sequentially forming a dielectric layer and a conductive layer on a main surface of a semiconductor substrate, forming and patterning a masking layer on the conductive layer to define a gate length, etching the conductive and dielectric layers at positions where the patterned masking layer is not formed to completely remove the conductive and dielectric layers thereat and expose the semiconductor substrate, forming a second masking layer on the first masking layer and the exposed main surface of the semiconductor substrate, patterning the second masking layer to expose a portion of the first masking layer and the main surface of the semiconductor substrate adjacent one side of the defined gate length, and etching the exposed main surface of the semiconductor substrate to form a depression in the main surface of the semiconductor substrate having a depth of at least 15% of a designed gate length. Subsequently, ions, from a continuously rotating ion source, are injected into the semiconductor substrate at an oblique angle to form source/drain impurity regions.

Still other features and advantages of the present invention will become readily apparent to those skilled in this art from the following detailed description, where only the preferred embodiment of the invention is shown and described, simply by way of illustration of the best mode contemplated of carrying out the invention. As will be realized, the invention is capable of other and different embodiments in various obvious respects, all without departing from the invention. Accordingly, the drawings and description are to be regarded as illustrative in nature, and not as restrictive.

DETAILED DESCRIPTION OF THE DRAWINGS

Figure 1A:
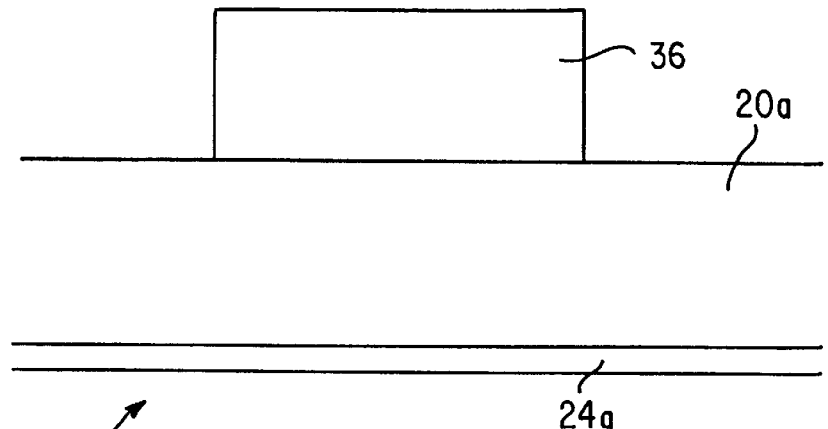
FIGS. 1(a) to 1(f) are schematic sectional views showing successive processes of manufacturing a conventional LDD MOSFET.
Figure 1B:
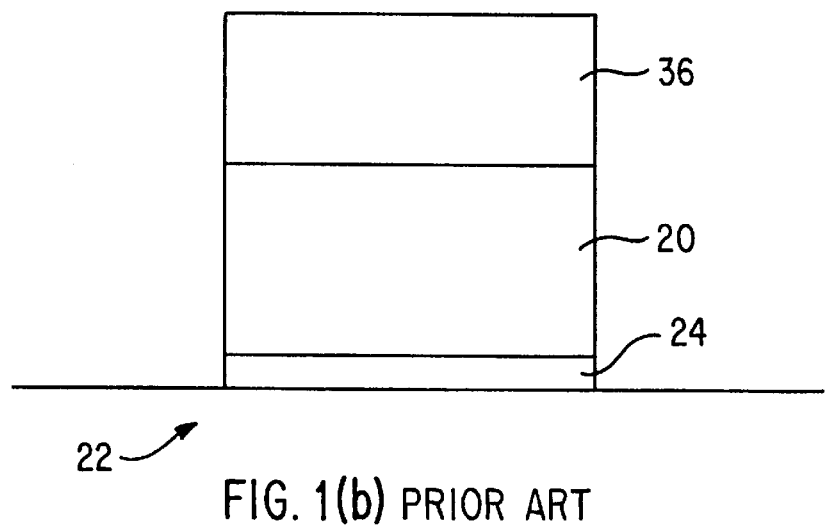
Figure 1C:
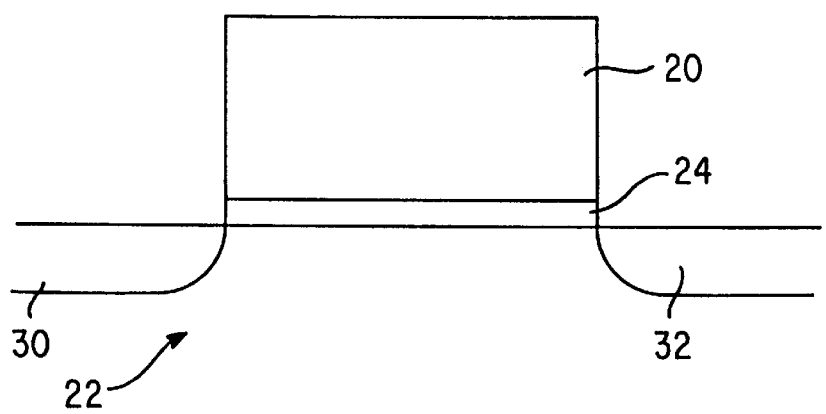
Figure 1D:
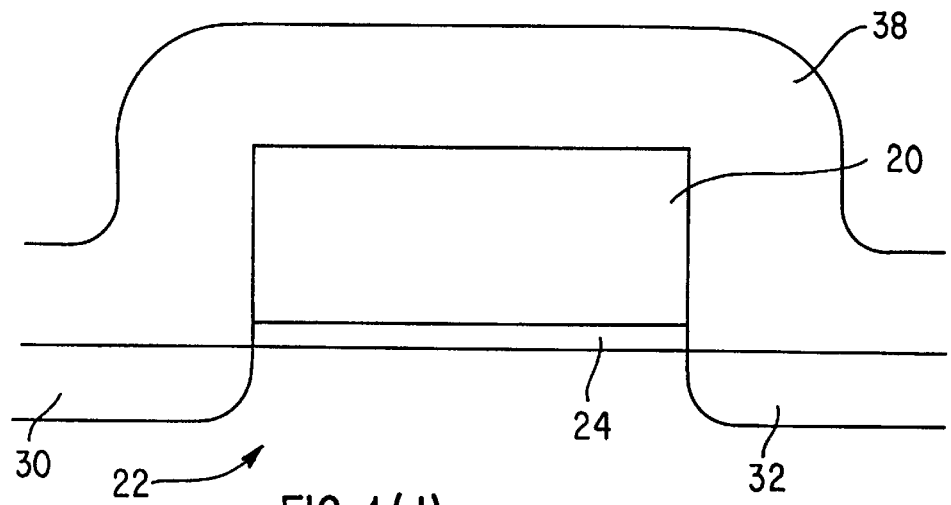
Figure 1E:
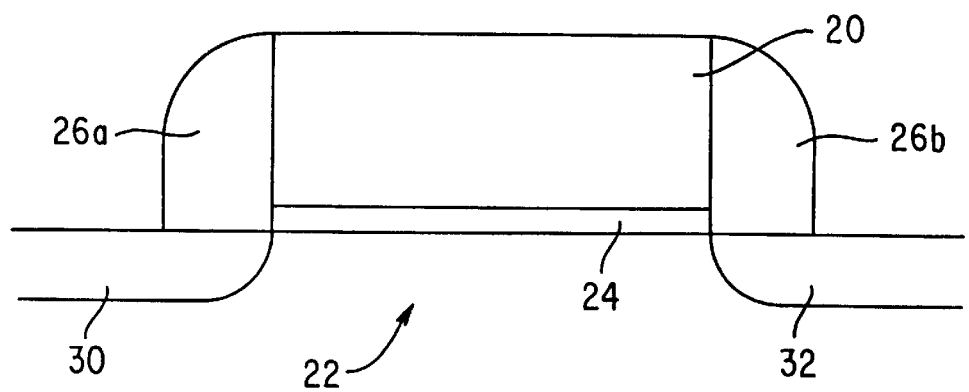
Figure 1F:
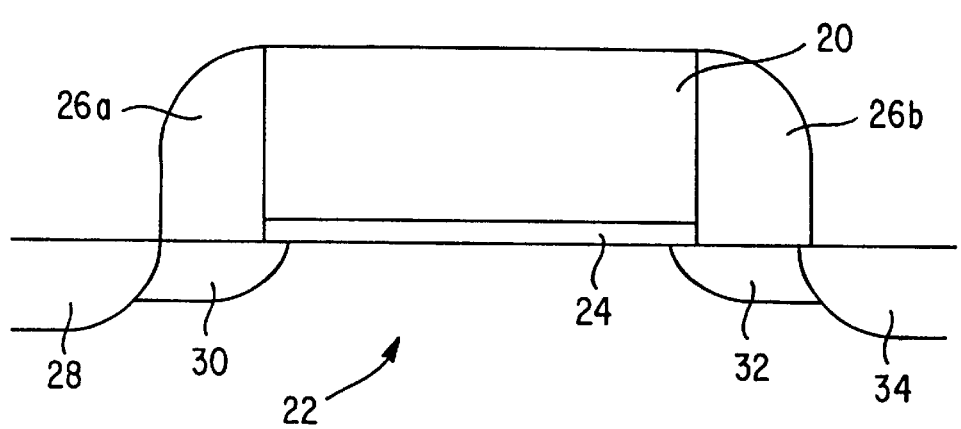
Figure 2:
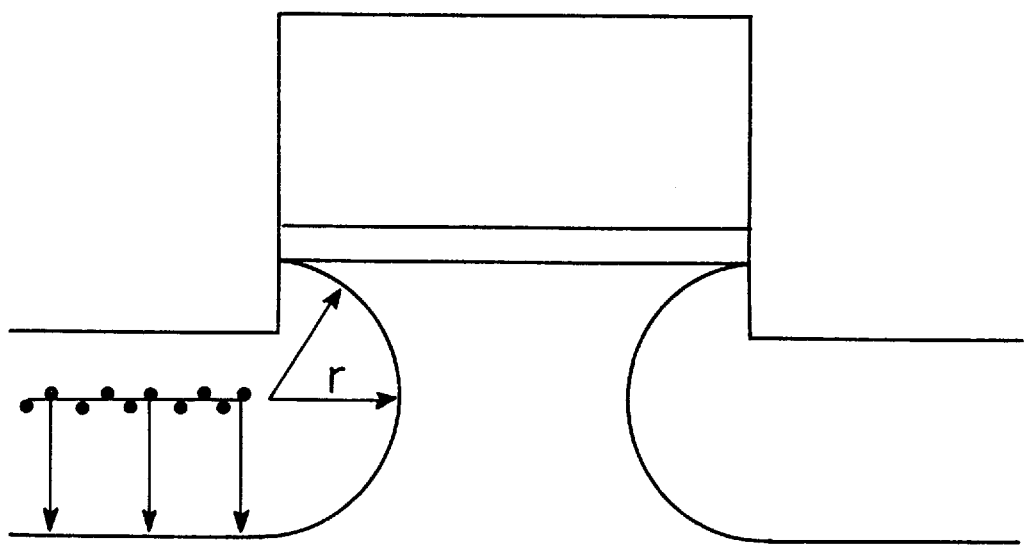
FIG. 2 is a schematic sectional view illustrating how implantation and diffusion create source/drain regions along vertical edges of a gate electrode of a conventional vertical transistor.
Figure 3A:
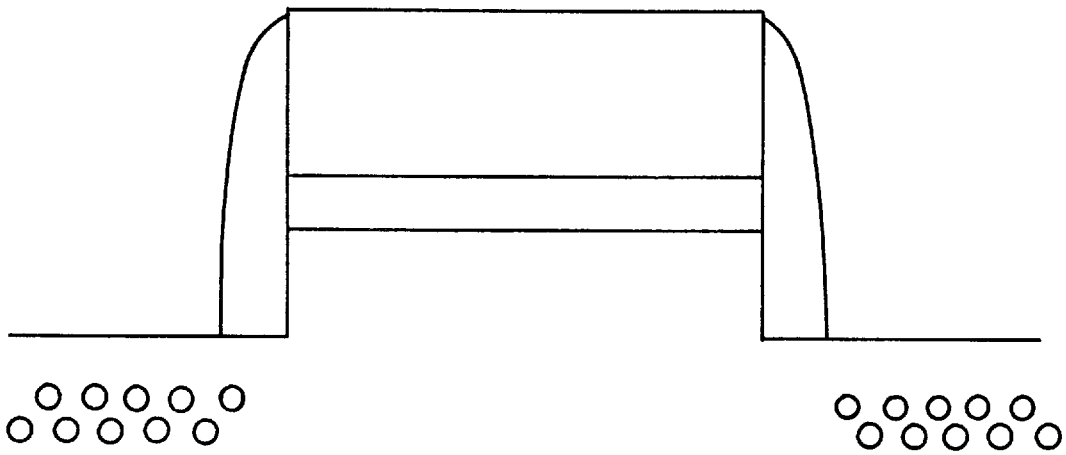
FIGS. 3(a) and 3(b) are schematic sectional views illustration how implantation and diffusion create source/drain regions along vertical edges of the gate electrode of the conventional vertical transistor with gate electrode oxide spacers.
Figure 3B:
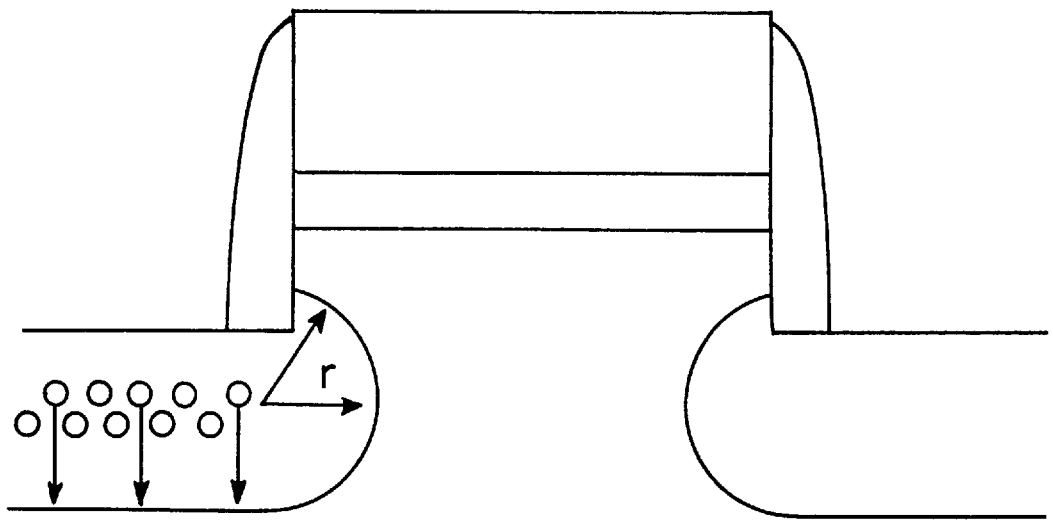
Figure 4:
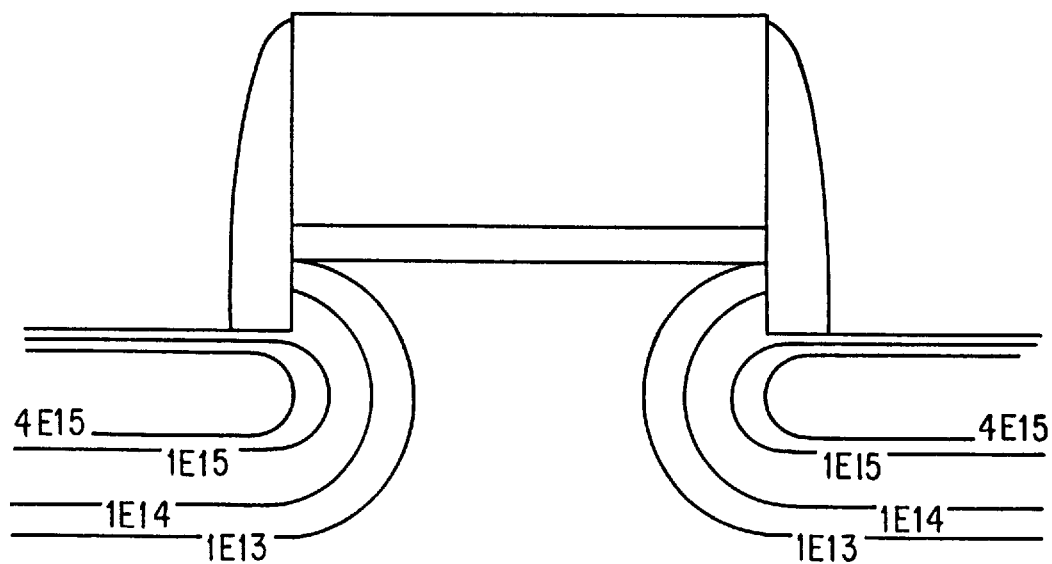
FIG. 4 is a schematic sectional view of the conventional vertical MOSFET with gate electrode oxide spacers showing contours of equal ion concentration.
Figure 5A:
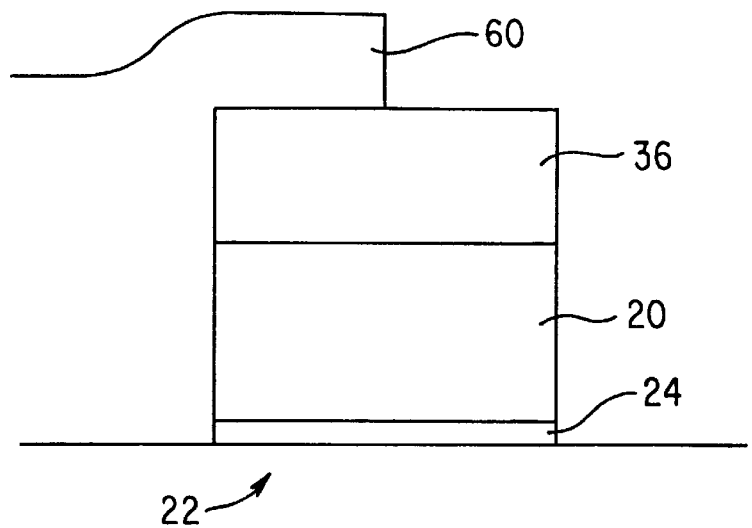
FIGS. 5(a) to 5(c) are schematic sectional views showing main successive processes of manufacturing an asymmetrical VLDD MOSFET.
Figure 5B:
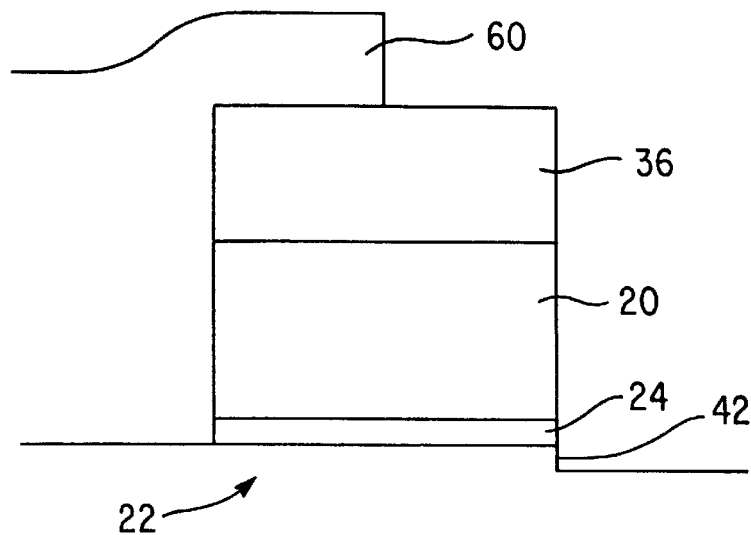
Figure 5C:
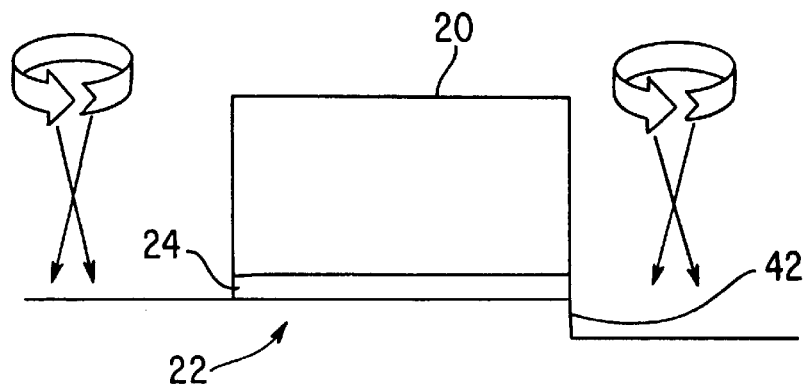

Referring to FIGS. 5(a) to 5(c), a process of manufacturing an asymmetrical VLDD MOSFET following the steps shown in FIGS. 1(a) and 1(b), is described. FIG. 5(a) shows a patterned resist 60 formed on portions of the resist 36, the gate electrode 20, the gate dielectric film 24, and the silicon substrate 22 on the source side of the gate electrode, Next, the exposed surface of the silicon substrate 22, on the drain side of the gate electrode 20, is etched using anisotropic etching (dry etching) forming a depressed area, where the drain region is to be formed, relative to the level of silicon substrate in the area beneath the gate electrode and the gate oxide film, and the area where the source region is to be formed as shown in FIG. 5(b).

Removal of a portion of the silicon substrate 20, in the area where the drain regions is to be formed, results in the formation of a step region 42 on the drain side of the gate electrode 20. Step region 42 is defined by a surface generally normal to the depressed surface of the silicon substrate 22, and the surface of the silicon substrate in the area beneath the gate electrode 20 and gate dielectric film 24, respectively. The depth of the depressed surface of the silicon substrate is typically at least 15% of the designed gate width to produce the desired effect. Generally the depth of the depressed surface of the silicon substrate is in the range of about 100 Å to 5,000 Å, depending on gate size.

Thereafter, the patterned resists 60 and 36 are removed and ions are implanted into the silicon substrate 22 and the step region 42 from a continuously rotating ion source (not shown) positioned at an oblique angle to the main surface of the silicon substrate 22 as shown in FIG. 5(c). Although separate ion sources for implanting on each opposing side of the gate electrode is depicted symbolically, it should be understood that a single ion source is used in practice. The ions are implanted in the silicon substrate at an angle in the range of about 75 to 82 degrees, at a concentration in the range of about $1 \times 10^{12}/cm^2$ to $5 \times 10^{13}/cm^2$, and at an energy level in the range of about 10 to 50 keV.

Figure 6:
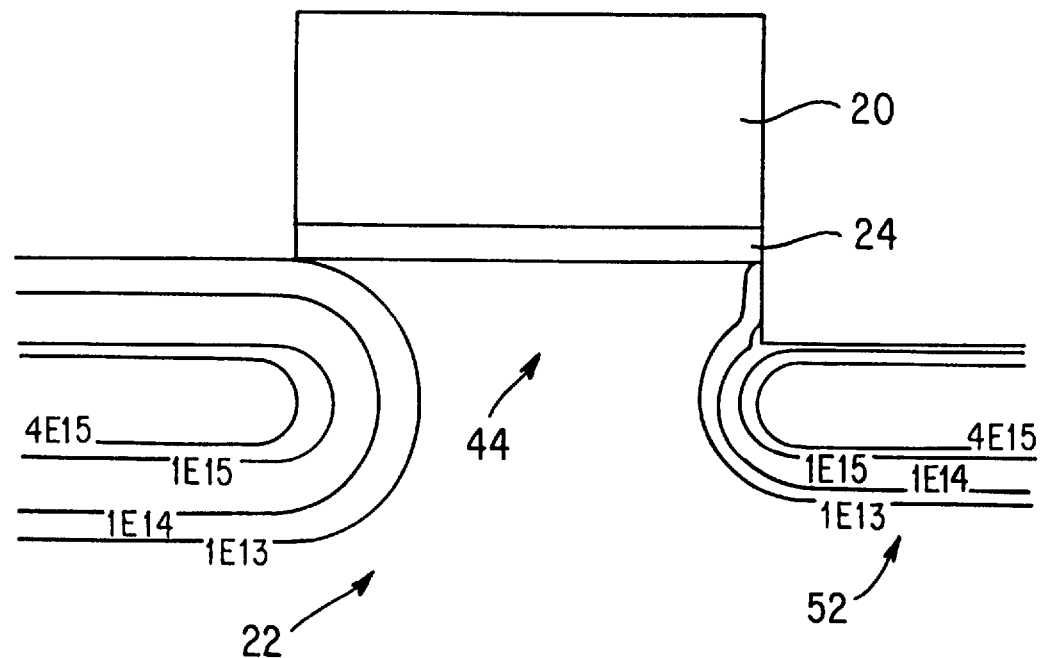
FIG. 6 is a schematic sectional view of the asymmetrical VLDD MOSFET showing contours of equal ion concentration.

FIG. 6 illustrates contours of equal ion concentration of the asymmetrical vertical MOSFET after ion implantation. As can be seen, the impurity profile of each of the source/drain regions 50 and 52 varies in concentration, increasing with lateral distance from the channel region 44 towards the source/drain regions 50 and 52. However, the contours of equal ion concentration in the drain region 52 is not Gaussian distributions as in the case of U.S. Pat. No. 5,041,885 to Gualandris et al., having been distorted by the angled rotating ion source and interaction thereof with step region 42. In particular, the interface between the drain region 52 and the channel region 44 beneath the end of gate dielectric 24 adjacent step region 42 is generally linear throughout a greater portion of the step region. In contrast, the interfaces between both the source/drain regions and the channel region in U.S. Pat. No. 5,041,885 to Gualandris et al. are generally curved.

Figure 7:
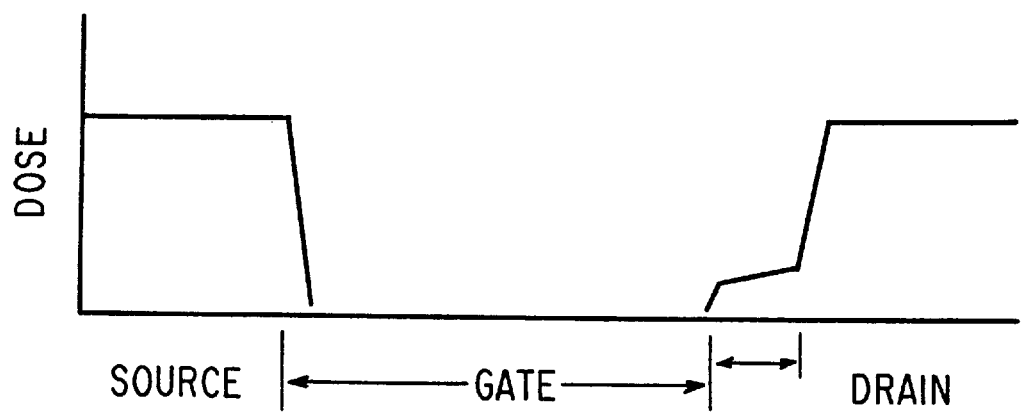
FIG. 7 is a graph illustrating a concentration profile of the asymmetrical VLDD MOSFET.

FIG. 7 is a graph illustrate the concentration profile of the asymmetrical vertical MOSFET after ion implanting. As illustrated, the drain region is connected to the channel region through an intermediate region A of relatively low concentration. The region A corresponds to the impurity concentration which results from step region 42.

There accordingly has been described an asymmetrical vertical MOSFET which couples the channel region to the drain junction region through an intermediate region of relatively low concentration. The manufacturing process of the asymmetrical VLDD MOSFET is not complex as no gate sidewall oxides are formed on the gate electrode. In addition, the source/drain regions of the asymmetrical VLDD MOSFET have an injection doping profile and not a diffusion doping profile. Since diffusion of implanted ions is not required, the channel length of the asymmetrical VLDD MOSFET can be controlled by controlling the energy level of ion implantation.

The many features and advantages of the invention are apparent from the detailed specification, and thus, it is intended by the appended claims to cover all such features and advantages of the invention which fall within the true spirit and scope of the invention. Since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An asymmetrical FET, comprising:
   a semiconductor substrate including a first region having an upper surface and a second region having an upper surface, the upper surface of the second region being formed at a position lower than the upper surface of the first region with an interface between the upper surface of the first region and the upper surface of the second region forming a step,
   a gate electrode formed through an insulating film on the upper surface of the first region adjacent the interface between the upper surface of the first region and the upper surface of the second region;
   a source impurity region formed on one side of the gate electrode in the upper surface of the first region and a drain impurity region formed on an opposing side of the gate electrode in (i) the upper surface of the second region, and (ii) the interface between the upper surface of the second region and the upper surface of the first region, extending to the upper surface of the first region; and a channel region formed under said gate electrode between said source impurity region and said drain impurity region.

2. The asymmetrical FET according to claim 1, wherein contours of equal ion concentration in the source impurity region are different from contours of equal ion concentration in the drain impurity region as a result of ions being injected into the step at the interface between the upper surface of the second region and the upper surface of the first region.

3. The asymmetrical FET according to claim 2, wherein contours of equal ion concentration in the source impurity region are substantially Gaussian and contours of equal ion concentration in the drain impurity region are substantially non-Gaussian.

4. The asymmetrical FET according to claim 1, wherein the source impurity region and the drain impurity region are formed without diffusion by injecting ions at an oblique angle to the semiconductor substrate from a continuously rotating ion source.

5. The asymmetrical FET according to claim 4, wherein the source impurity region and drain impurity region are formed by injecting ions into the semiconductor substrate from the continuously rotating ion source at an angle in the range of about 75 to 82 degrees, at a concentration in the range of about $1\times10^{12}/cm^2$ to $5\times10^{13}/cm^2$, and at an energy level in the range of about 10 to 50 keV.

6. An asymmetrical FET, including a semiconductor substrate including a first region having an upper surface and a second region having an upper surface, the upper surface of the second region being formed at a position lower than the upper surface of the first region with an interface between the upper surface of the first region and the upper surface of the second region forming a step, a gate electrode formed through an insulating film on the upper surface of the first region adjacent the interface between the upper surface of the first region and the upper surface of the second region;

a source impurity region formed on one side of the gate electrode in the upper surface of the first region and a drain impurity region formed on an opposing side of the gate electrode in (i) the upper surface of the second region, and (ii) the interface between the upper surface of the second region and the upper surface of the first region, extending to the upper surface of the first region; and a channel region formed under said gate electrode between said source impurity region and said drain impurity region, the source impurity region and the drain impurity region being formed by the process comprising the step of:

injecting ions from a continuously rotating ion source at an angle in the range of about 75 to 82 degrees, at a concentration in the range of about $1\times10^{12}/cm^2$ to $5\times10^{13}/cm^2$, and at an energy level in the range of about 10 to 50 keV, forming the source impurity region with contours of equal ion concentration which are substantially Gaussian and the drain impurity region with contours of equal ion concentration which are substantially non-Gaussian as a result of ions being injected into the step at the interface between the upper surface of the second region and the upper surface of the first region.

* * * * *